(12) United States Patent
Kumaki

(10) Patent No.: US 7,792,656 B2
(45) Date of Patent: Sep. 7, 2010

(54) TEST APPARATUS

(75) Inventor: Norio Kumaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 348 days.

(21) Appl. No.: 11/959,470

(22) Filed: Dec. 19, 2007

(65) Prior Publication Data

US 2009/0164167 A1    Jun. 25, 2009

(51) Int. Cl.
*G01R 31/14* (2006.01)
*G01M 19/00* (2006.01)

(52) U.S. Cl. .................. 702/120; 702/121; 702/122; 702/123; 365/201

(58) Field of Classification Search ......... 702/121–126, 702/120, 182–188; 365/189.05, 230.08, 365/201

See application file for complete search history.

(56) References Cited

U.S. PATENT DOCUMENTS 6,557,128 B1 *   4/2003   Turnquist .................. 714/724

7,552,370 B2 *   6/2009   Pochowski .................. 714/718

FOREIGN PATENT DOCUMENTS

| JP | S64-47148 | 3/1989 |
| JP | S58-58633 | 4/1989 |
| JP | 2000-105261 | 4/2000 |

* cited by examiner

*Primary Examiner*—Eliseo Ramos Feliciano
*Assistant Examiner*—Phuong Huynh
(74) *Attorney, Agent, or Firm*—Osha • Liang LLP

(57) ABSTRACT

A test apparatus that tests a device under test is provided, including a plurality of testing units that are mapped to a control bus address space and that test the device under test; a control processor that executes a plurality of test control programs to control each testing unit corresponding to each test control program; a plurality of address registers that are mapped to a control processor address space and store an address in the control bus address space of one of the testing units when written thereon by the control processor; and a plurality of data registers that are mapped to the control processor address space, that are disposed to correspond one-to-one with the plurality of address registers, and that store data that is written thereto and read therefrom by the testing unit designated by the address stored in the corresponding address register.

11 Claims, 5 Drawing Sheets

TEST APPARATUS

BACKGROUND

1. Technical Field

The present invention relates to a test apparatus. More particularly, the present invention relates to a test apparatus that tests a device under test by using a plurality of test control programs.

2. Related Art

As a test apparatus that tests a device under test such as a semiconductor circuit, a test apparatus that uses a plurality of testing units is known. For example, the plurality of testing units are disposed to correspond to a plurality of devices under test or to a plurality of pins of a device under test. Each testing unit tests a corresponding device under test by sending signals to and receiving signals from the device under test.

The test apparatus stores in advance a plurality of test control programs corresponding to the plurality of testing units. The test apparatus controls each testing unit by executing each test control program.

Furthermore, the plurality of testing units are connected to a single control bus and are mapped in the control bus address space. More specifically, an address in the control bus address space is allocated for each testing unit.

Here, causing a control processor of the test apparatus to control each testing unit by mapping each control bus address space to an address space of the control processor is considered. However, there are cases where the control bus address space cannot be mapped to the control processor address space because, for example, the control bus address space is too large for the control processor address space.

In such a case, providing a single address register that designates an address in the control bus and a single data register used for transmitting and receiving data to and from a testing unit corresponding to the designated address is considered. In this case, the control processor generates address data that designates a testing unit corresponding to each test control program and test data that controls the testing units by executing each test control program and writes the generated data onto the address register and the data register.

The data register controls the testing unit designated by the address data written onto the address register based on the test data written onto the data register itself By doing this, the plurality of testing units can be controlled to test the devices under test, even when the control bus address space cannot be mapped onto the control processor address space.

When using just one grouping of the address register and the data register, however, exclusion control or the like must be implemented, resulting in cases where each testing unit cannot operate correctly. For example, while a test control program A is being executed in the control processor, there are cases where the testing unit cannot be controlled correctly because of an interruption or the like when a task switch to a test control program B occurs.

As a more specific example, a case will be explained in which test control program B is executed to perform access D2 for an address A2 of the control bus after test control program A is executed to perform access D1 for an address A1 of the control bus. First, the control processor writes the address A1 to the address register. It is assumed that the task switch to the test control program B occurs here.

In such a case, the control processor executes the test control program B to perform access D2 for the address A2 by writing the address A2 to the address register and writing the access D2 to the data register. It is assumed that a task switch back to the test control program A occurs here.

The control processor again executes the test control program A to write the access D1 onto the data register. However, because the address A2 is written to the address register, the access D1 that should be performed for the address A1 is instead performed for the address A2. In this manner, a problem arises that the expected operation cannot be performed when a task switch arises for some reason in a case where one grouping of the address register and the data register is used.

In response to this problem, performing control such as the exclusion control, a thread control, or interrupt disabling is considered. However, the test control program or the like must be programmed for such control, which increases the chances of a bug arising in the programming and also increases the time necessary to perform the program.

SUMMARY

Therefore, it is an object of an aspect of the innovations herein to provide a test apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may include a test apparatus that tests a device under test. The test apparatus includes a plurality of testing units that are mapped to a control bus address space and that test the device under test; a control processor that executes a plurality of test control programs to control each testing unit corresponding to each test control program; a plurality of address registers that are mapped to a control processor address space and store an address in the control bus address space of one of the testing units when written thereon by the control processor; and a plurality of data registers that are mapped to the control processor address space, that are disposed to correspond one-to-one with the plurality of address registers, and that store data that is written thereto and read therefrom by the testing unit designated by the address stored in the corresponding address register.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
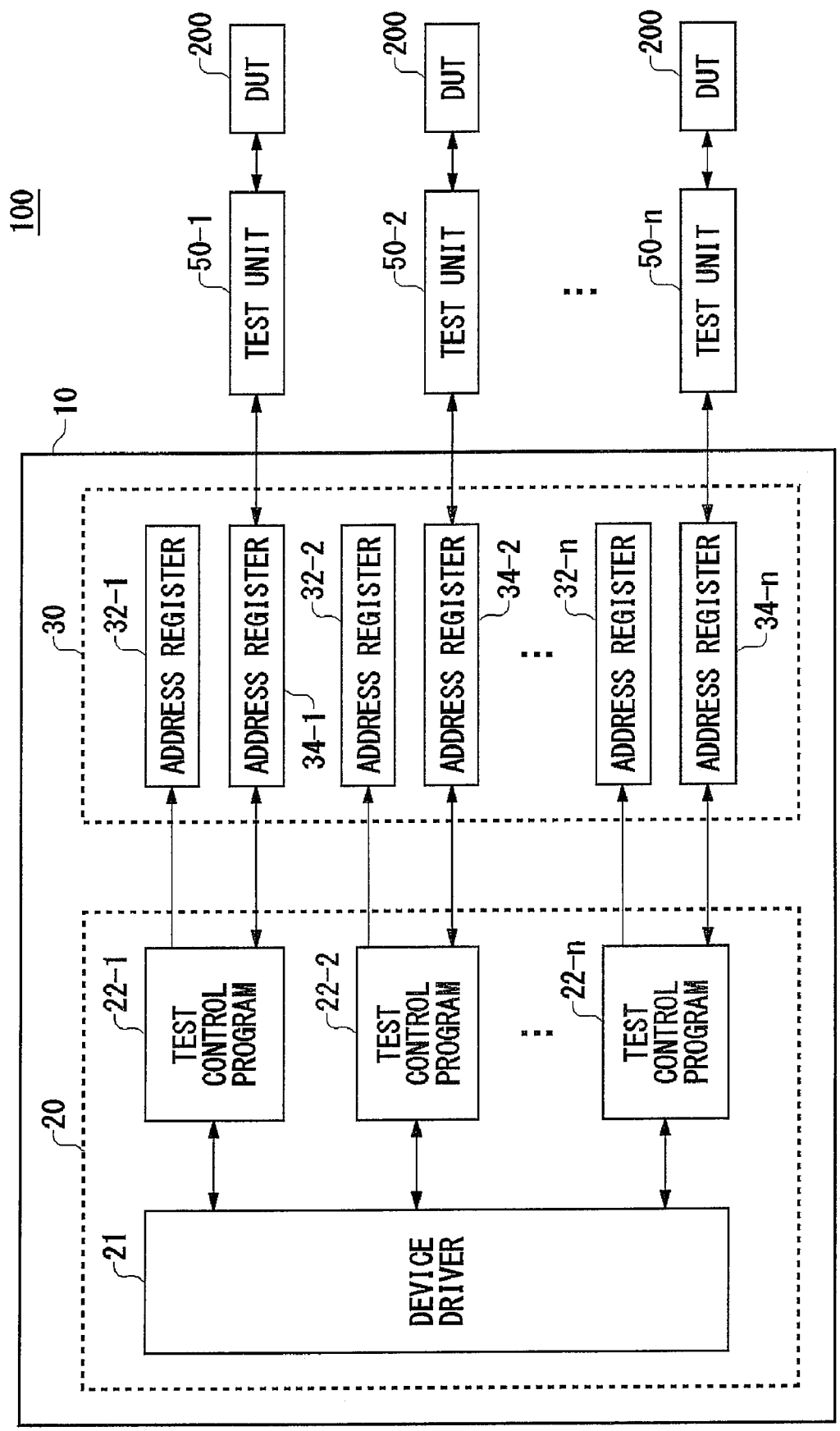
FIG. 1 shows a configuration of the test apparatus 100 according to an embodiment along with a device under test 200.

FIG. 1 shows a configuration of the test apparatus 100 according to the present embodiment along with a device under test 200. The test apparatus 100 of the present embodiment is an apparatus that tests the device under test 200 such as a semiconductor circuit and can cause each testing unit to operate correctly, even when a task switch arises, by allocating an address register 32 and a data register 34 for each test control program 22.

The test apparatus 100 is provided with a test control section 10 and a plurality of testing units 50. The test control section 10 controls the plurality of testing units 50 by performing a plurality of test control programs 22 or the like provided in advance. The test control section 10 may be a CPU, for example.

The plurality of testing units 50 are disposed to correspond to a plurality of devices under test 200 or to a plurality of pins of a device under test 200. In the present embodiment, the test apparatus 100 is provided with the plurality of testing units 50 corresponding one-to-one with the plurality of devices under test 200, and the test apparatus 100 tests the plurality of devices under test 200 in parallel.

Each testing unit 50 tests a corresponding device under test 200 by transmitting and receiving signals to and from the device under test 200. Furthermore, the plurality of testing units 50 transmits and receives data to and from the test control section 10 via a common control bus.

Each testing unit 50 is arranged (mapped) in a control bus address space. More specifically, an address in the control bus address space is allocated for each testing unit 50 and the test control section 10 transmits and receives data to and from each testing unit 50 based on the allocated addresses.

It should be noted that each testing unit 50 may include a plurality of test modules. For example, each testing unit 50 may include a test module that tests an operational mode of the device under test 200, a test module that inputs a prescribed logic pattern into the device under test 200, a test module that supplies a supply power to the device under test 200, or the like.

Furthermore, each test module may be mapped in the control bus address space. For example, test modules disposed in the same testing unit 50 may have a common upper bit in an address in the control bus address space. The test control section 10 may transmit and receive data to and from each test module based on the aforementioned address.

The test control section 10 includes a control processor 20 and a control bus interface 30. The control processor 20 is provided in advance with the plurality of test control programs 22 and a device driver 21 and controls the plurality of testing units 50 by executing the plurality of test control programs 22. For example, the control processor 20 may generate test data supplied to the testing units 50 and address data that designates to which testing unit 50 the test data is to be supplied by executing the test control programs 22.

The test control programs 22 in the present embodiment are provided in an amount equal to the amount of testing units 50. The control processor 20 executes each test control program 22 to control each testing unit 50 corresponding to each test control program. Furthermore, the device driver 21 may be software provided to control hardware of the test apparatus 100 according to the test control programs 22 or the like.

The control bus interface 30 transfers data between the control processor 20 and the plurality of testing units 50. The control bus interface 30 includes the plurality of address registers 32 and the plurality of data registers 34. The plurality of address registers 32 and the plurality of data registers 34 are disposed to correspond one-to-one with each other.

Pairs of an address register 32 and a data register 34 are disposed in an amount at least equal to the amount of test control programs 22. In the configuration shown in FIG. 1, the number of pairs of an address register 32 and a data register 34 that are disposed is equal to the number of test control programs 22 (n pairs). The control processor 20 allocates at least one pair of an address register 32 and a data register 34 for each test control program 22 before executing each test control program 22 to generate the test data and the address data.

Each address register 32 is mapped to the control processor 20 address space and has an address of one of the testing units 50 in the control buss address space written thereon by the control processor 20 to store the address. In the present embodiment, each address register 32 stores the address data generated according to the corresponding test control program 22. It should be noted that the control processor 20 address space and the control bus address space may be virtual address spaces.

Each data register 34 is mapped to the control processor 20 address space and stores data written thereto and read therefrom by a testing unit 50 designated by the address data stored in the corresponding address register 32. For example, each data register 34 may store test data such as data to be written to the memory or the like of the testing unit 50 designated by the address data or command data that controls the testing unit 50 designated by the address data.

Each data register 34 may store the test data generated according to a corresponding test control program 22. Each data register 34 may also store the data to be read from the memory or the like of the testing unit 50 designated by the address data.

In this way, by providing the address registers 32 and the data registers 34, the control processor 20 can control the testing units 50 via the address registers 32 and data registers 34 even when the control bus address space cannot be mapped to the control processor 20 address space. Furthermore, because at least one pair of an address register 32 and a data register 34 are allocated for each test control program 22, each testing unit 50 can be caused to operate correctly according to each test control program 22 without implementing the exclusion control or the like, even when a task switch arises because of an interruption or the like.

Furthermore, because it is not necessary to implement the exclusion control or the like, creating the test control programs 22 and the device driver 21 becomes easier and the chance of a bug arising can be decreased. Yet further, the time necessary for performing the program can be shortened, thereby shortening the test time.

Figure 2:
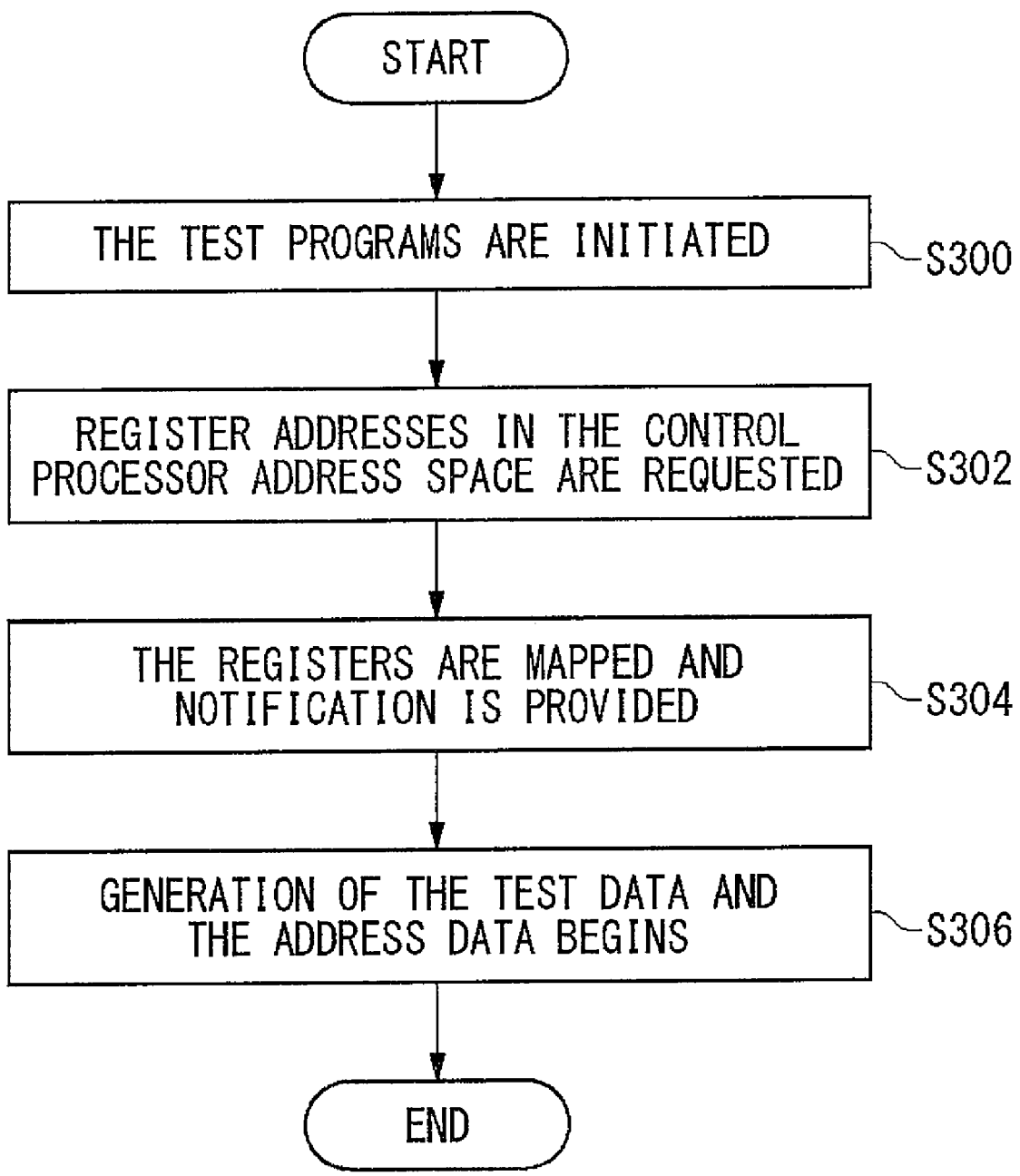
FIG. 2 is a flow chart showing an exemplary operation of the test apparatus 100.

FIG. 2 is a flow chart showing an exemplary operation of the test apparatus 100. First, when the device under test 200 is tested, the control processor 20 initiates each test control program 22 (S300). The control processor 20 may initiate the plurality of test control programs 22 in parallel.

The control processor 20, when performing each test control program 22, allocates a pair of an address register 32 and a data register 34 for each test control program 22. For example, each initiated test control program 22 requests the control processor 20 to perform a process to allocate an address register 32 and a data register 34. More specifically, each initiated test control program 22 requests from the control processor 20 an address in the control processor 20 address space of an allocated address register 32 and data register 34 (S302).

The control processor 20, in response to the request for the allocation process, allocates a data register 34 and an address register 32 that are not allocated to other test control programs 22 to the test control program 22 requesting the address. The control processor 20 may execute the allocation process using the device driver 21.

More specifically, the control processor 20 maps an address register 32 and a data register 34 that are not allocated to other test control programs 22 onto the control processor 20 address space (allocates the addresses in the address space) in response to the request from the test control program 22.

The control processor 20 notifies the test control program 22 about the address allocated to the address register 32 and the data register 34 (S304). Here, the process for notifying the test control program 22 about the address may be, for example, a process in which the address is stored as an address value to be used when the control processor 20 executes the test control program 22. The control processor 20 may map the address register 32 and the data register 34 to the control processor 20 address space using software such as an operating system supplied in advance.

In the operation of such software, each test control program 22 requests the address of an address register 32 and a data register 34 from the operating system when each test control program 22 is initiated. The operating system works with the device driver 21 that manages the address registers 32 and the data registers 34 to map onto the control processor 20 address space an address register 32 and a data register 34 to be allocated for each test control program 22.

The operating system notifies the test control program 22 about the mapped address registers 32 and data registers 34. According to the operation of the software described above, an address register 32 and a data register 34 can be allocated for each test control program 22 by a calculation process or the like performed by the control processor 20.

After an address register 32 and a data register 34 are allocated for each test control program 22, the control processor 20 begins generating the test data and the address data to test the devices under test 200 (S306). At this time, the control processor 20 writes the test data and the address data generated according to each test control program 22 onto a data register 34 and an address register 32 corresponding to the test control program 22. The control processor 20 may write the test data and the address data onto an address allocated for the data register 34 and the address register 32.

Each data register 34 controls a testing unit 50 designated by the address data written onto a corresponding address register 32 according to the test data written onto the data register 34 itself. Through such a process, the devices under test 200 can be tested using a plurality of test control programs 22 without executing the exclusion control or the like.

Figure 3:
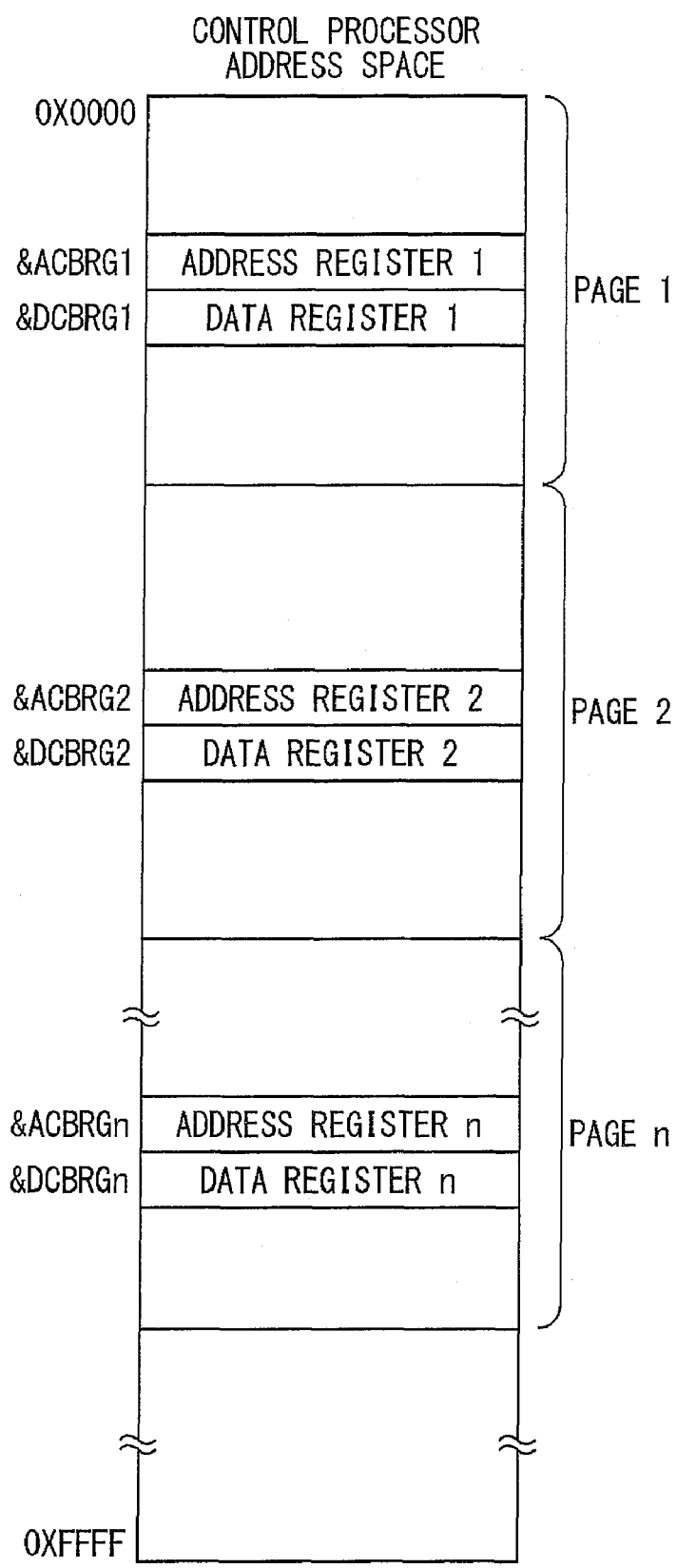
FIG. 3 is a schematic diagram describing an example of a control processor 20 address space.

FIG. 3 is a schematic diagram describing an example of the control processor 20 address space. The control processor 20 of the present embodiment includes an address space of OX0000 to OXFFFF. In FIG. 3, "&ACBRGm" indicates the address of the address register 32-$m$ mapped to the address space and "&DCBRGm" indicates the address of the data register 34-$m$ mapped to the address space.

The control processor 20 manages the address space by dividing the address space into a plurality of pages. The control processor 20 may manage each test control program 22 in association with each page of the address space. In such a case, the control processor 20 may manage each page such that pages other than pages corresponding to the test control program 22 cannot be accessed in the process of the test control program 22.

As shown in FIG. 3, the control processor 20 of the present embodiment maps a pair of an address register 32 and a data register 34 corresponding to each test control program 22 onto a different page in the control processor 20 address space for each test control program 22. For example, the control processor 20 may map an address register 32 and a data register 34 allocated for a given test control program 22 onto the page corresponding to the test control program 22. Through such a process, the control processor 20 can prevent access of the address registers 32 and the data registers 34 that are not allocated to the test control program 22 in the process of each test control program 22.

Figure 4:
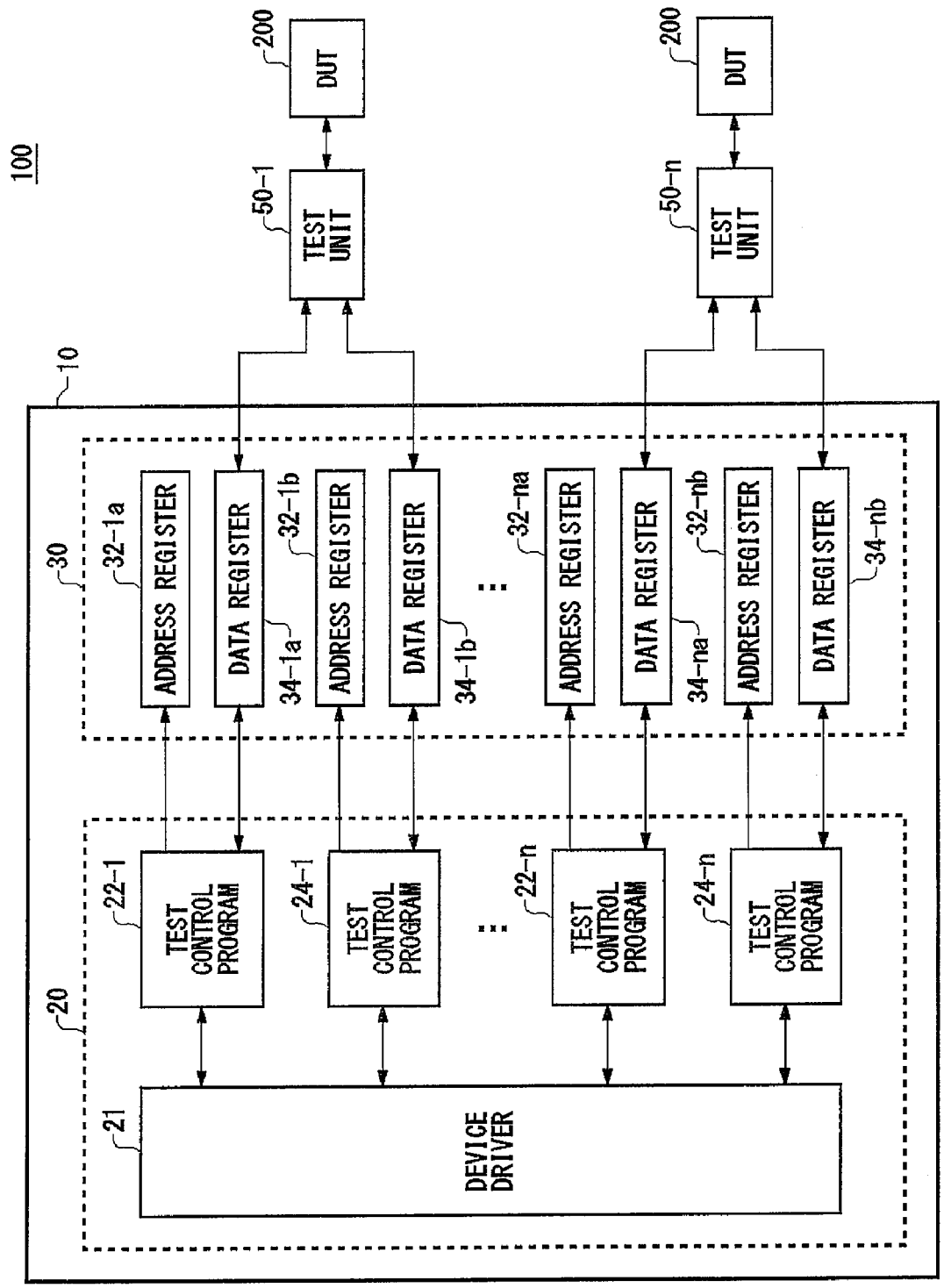
FIG. 4 shows another example of the test apparatus 100.

FIG. 4 shows another example of the test apparatus 100. In the test apparatus 100 of the present embodiment, the control processor 20 operates further based on a plurality of interruption control programs 24 to control each testing unit 50. The plurality of interruption control programs 24 are disposed to correspond one-to-one with the plurality of testing units 50 and interrupt a process performed by the control processor 20 during execution of the test control programs 22.

For example, each interruption control program 24 may execute a process to interrupt the control processor 20 when predetermined data is written to a data register 34 from a corresponding testing unit 50. The data register 34 may be a register corresponding to a test control program 22. The control processor 20, in response to a request from an interruption control program 24, generates interruption data to be supplied to a corresponding testing unit 50 and interruption address data that designates the testing unit 50.

The control processor 20 further includes a plurality of pairs of an address register 32 and a data register 34 disposed to correspond one-to-one with the plurality of interruption control programs 24. An address register 32 corresponding to an interruption control program 24 stores the interruption address data generated by the corresponding interruption control program 24. A data register 34 corresponding to an interruption control program 24 stores the interruption data generated by the control processor 20 according to the corresponding interruption control program 24 and controls a testing unit 50 designated by the interruption address data according to the interruption data.

In the manner described above, the control processor 20 may map an address register 32 and a data register 34 allocated for a given test control program 22 onto the page in the address space corresponding to the test control program 22. In addition, the control processor 20 may map an address register 32 and a data register 34 allocated for a given interruption control program 24 onto the same page that an address register 32 and a data register 34 allocated to a test control program 22 corresponding to the same testing unit 50 are mapped onto.

The control processor 20 may, for example, map an address register 32-1$a$, a data register 34-1$a$, an address register 32-1$b$, and a data register 34-1$b$ corresponding to a test control program 22-1 and an interruption control program 24-1 onto the same page in the control processor 20 address space.

Furthermore, the control processor 20 may execute the allocation process of an address register 32 and a data register 34 for an interruption control program 24 in parallel with the allocation process of an address register 32 and a data register 34 for a test control program 22. The allocation process of an address register 32 and a data register 34 for an interruption control program 24 may be the same as the allocation process of an address register 32 and a data register 34 for a test control program 22 described in relation to FIG. 2.

In the manner described above, each testing unit 50 can be caused to operate correctly, even when a process by an interruption control program 24 arises, by providing an address register 32 and a data register 34 for each interruption control program 24. Therefore, the devices under test 200 can be accurately tested.

Figure 5:
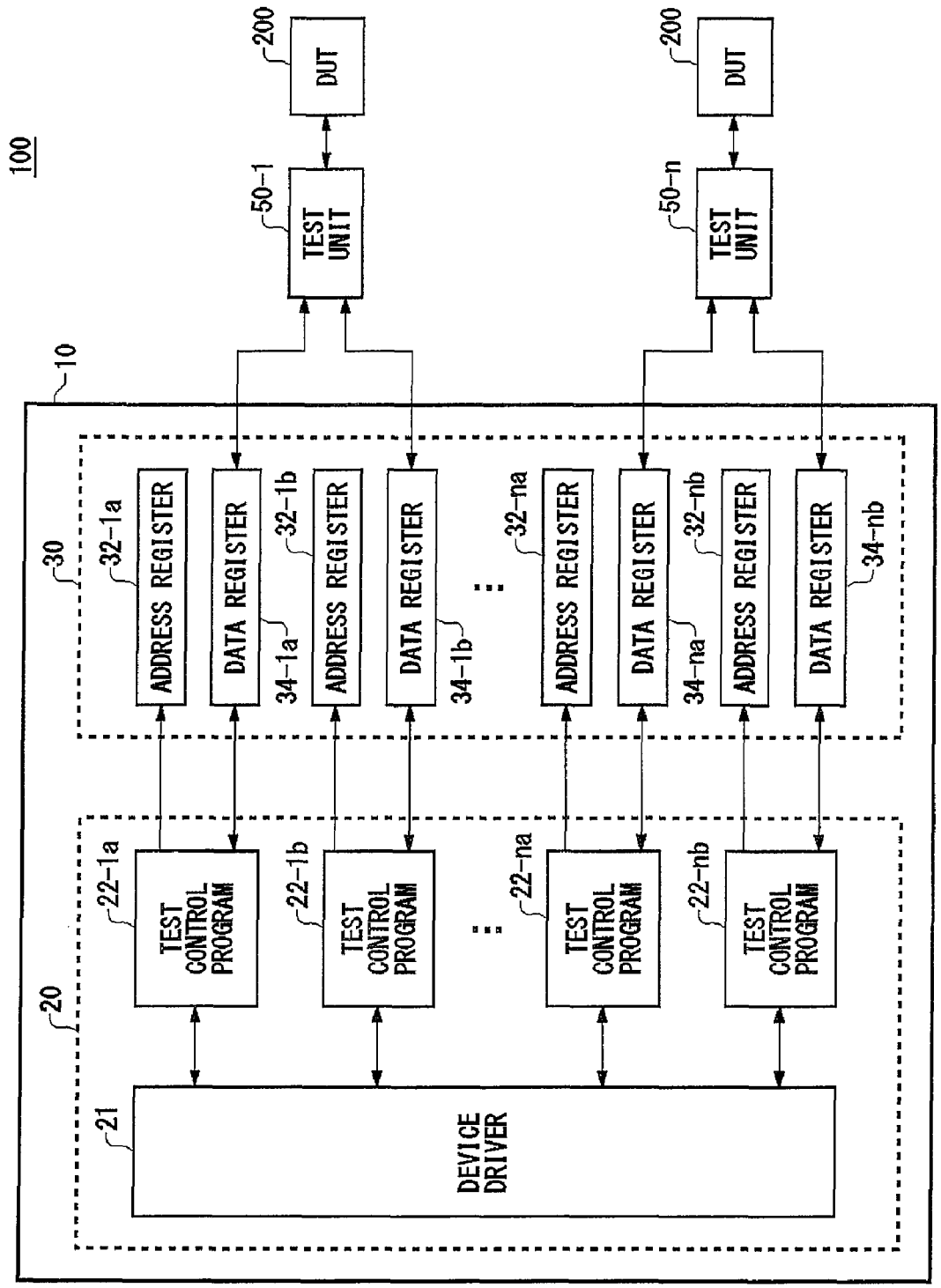
FIG. 5 shows another example of the test apparatus 100.

FIG. 5 shows another example of the test apparatus 100. In the test apparatus 100 of the present embodiment, a plurality of test control programs 22 are provided for a single testing unit 50. Even in such a case, the control bus interface 30 includes at least one pair of an address register 32 and a data register 34 for each test control program 22. Address registers 32 and data registers 34 associated with the same testing unit 50 may be mapped onto the same page in the control processor 20 address space.

By using such a configuration, each testing unit 50 can be made to operate correctly without using the exclusion control or the like, even when a single testing unit 50 is made to function using a plurality of test control programs 22. Therefore, the devices under test 200 can be accurately tested. Furthermore, because the exclusion control or the like is not implemented, a program that controls the test apparatus 100 can be created easily.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, through the embodiments of the present invention, testing units can be caused to operate correctly, without using an exclusion control or the like, when the testing units are controlled using a plurality of test control programs.

What is claimed is:

1. A test apparatus that tests a device under test, comprising:
    a plurality of testing units that are mapped to a control bus address space and that test the device under test;
    a control processor that executes a plurality of test control programs to control each testing unit corresponding to each test control program;
    a plurality of address registers that are mapped to a control processor address space and store an address in the control bus address space of one of the testing units when written thereon by the control processor; and
    a plurality of data registers that are mapped onto the control processor address space, that are disposed to correspond one-to-one with the plurality of address registers, and that store data that is written thereto and read therefrom by the testing unit designated by the address stored in the corresponding address register,
    wherein the control processor allocates at least one address register and one data register to each test control program and writes test data and address data generated according to each test control program onto the corresponding address register and data register.

2. The test apparatus according to claim 1, wherein the control processor, when operating according to each test control program, maps onto the control processor address space the address register and the data register to be allocated to each test control program and writes the test data and the address data generated according to each test control program onto the mapped address registers and data registers.

3. The test apparatus according to claim 2, wherein the control processor manages the control processor address space by dividing the address space into a plurality of pages and maps the address register and the data register corresponding to each test control program to a different page in the control processor address space.

4. The test apparatus according to claim 3, wherein
    the control processor operates according to a plurality of interruption control programs, which are disposed to correspond one-to-one with the plurality of testing units, to further generate interruption data to be supplied to each testing unit and interruption address data that designates the testing unit,
    the address registers and the data registers are disposed in a number equal to a number of the test control programs and the interruption control programs, and
    each address register and data register stores data generated by the control processor according to the associated test control program and interruption control program.

5. The test apparatus according to claim 4, wherein the control processor arranges in the same page in the control processor address space two pairs of the address registers and the data registers corresponding to the test control program and the interruption control program that supply data to the same testing unit.

6. A test apparatus that tests a device under test, comprising:
    a plurality of testing units that are mapped to a control bus address space and that test the device under test;
    a control processor that executes a plurality of test control programs to control each testing unit corresponding to each test control program;
    a plurality of address registers that are mapped to a control processor address space and store an address in the control bus address space of one of the testing units when written thereon by the control processor; and
    a plurality of data registers that are mapped onto the control processor address space, that are disposed to correspond one-to-one with the plurality of address registers, and that store data that is written thereto and read therefrom by the testing unit designated by the address stored in the corresponding address register,
    wherein the plurality of address registers and the plurality of data registers are disposed in a number at least equal to a number of the plurality of test control programs, and
    the control processor, when executing each test control program, allocates one address register and one data register for each test control program and writes test data and address data generated according to each test control program onto the address register and the data register corresponding to each test control program.

7. A test apparatus that tests a device under test, comprising:
    a plurality of testing units that are mapped to a control bus address space and that test the device under test;
    a control processor that executes a plurality of test control programs to control each testing unit corresponding to each test control program;
    a plurality of address registers that are mapped to a control processor address space and store an address in the control bus address space of one of the testing units when written thereon by the control processor; and
    a plurality of data registers that are mapped onto the control processor address space, that are disposed to correspond one-to-one with the plurality of address registers, and that store data that is written thereto and read therefrom by the testing unit designated by the address stored in the corresponding address register,
    wherein the control processor, before generating the data according to each test control program, allocates at least one address register and one data register to each test control program and writes test data and address data generated according to each test control program onto the corresponding address register and data register.

8. The test apparatus according to claim 7, wherein the control processor, when operating according to each test control program, maps onto the control processor address space the address register and the data register to be allocated to each test control program and writes the test data and the address data generated according to each test control program onto the mapped address registers and data registers.

9. The test apparatus according to claim 8, wherein the control processor manages the control processor address space by dividing the address space into a plurality of pages and maps the address register and the data register corresponding to each test control program to a different page in the control processor address space.

10. The test apparatus according to claim 9, wherein the control processor operates according to a plurality of interruption control programs, which are disposed to correspond one-to-one with the plurality of testing units, to further generate interruption data to be supplied to each testing unit and interruption address data that designates the testing unit, the address registers and the data registers are disposed in a number equal to a number of the test control programs and the interruption control programs, and each address register and data register stores data generated by the control processor according to the associated test control program and interruption control program.

11. The test apparatus according to claim 10, wherein the control processor arranges in the same page in the control processor address space two pairs of the address registers and the data registers corresponding to the test control program and the interruption control program that supply data to the same testing unit.

\* \* \* \* \*